United States Patent [19]

Shioleno

[11] Patent Number: 4,499,524
[45] Date of Patent: Feb. 12, 1985

[54] HIGH VALUE SURFACE MOUNTED CAPACITOR

[75] Inventor: Lewis J. Shioleno, Milwaukee, Wis.

[73] Assignee: North American Philips Corporation, New York, N.Y.

[21] Appl. No.: 549,112

[22] Filed: Nov. 7, 1983

[51] Int. Cl.³ ............................................. H05K 7/06
[52] U.S. Cl. .................................................... 361/404
[58] Field of Search .............. 361/320, 321, 306, 308, 361/309, 310, 392, 393, 394, 402, 404, 407

[56] References Cited

U.S. PATENT DOCUMENTS

| | | | |
|---|---|---|---|
| 1,577,195 | 3/1926 | Rose | 361/310 X |
| 2,229,694 | 1/1941 | Ducati | 361/310 |
| 3,395,318 | 7/1968 | Laermer et al. | 361/404 |
| 3,612,963 | 10/1971 | Piper et al. | 361/321 |
| 4,423,468 | 12/1983 | Gatto et al. | 361/404 |

FOREIGN PATENT DOCUMENTS 126288  1/1932  Austria .............................. 361/310

Primary Examiner—Donald A. Griffin
Attorney, Agent, or Firm—Jack E. Haken; James J. Cannon, Jr.

[57] ABSTRACT

A high value surface mounted capacitor assembled from a ganged assembly of multilayer ceramic capacitors adapted to fit within a package which may be either surface mounted or pin mounted, said package being shaped for handling by automatic insertion equipment.

2 Claims, 7 Drawing Figures

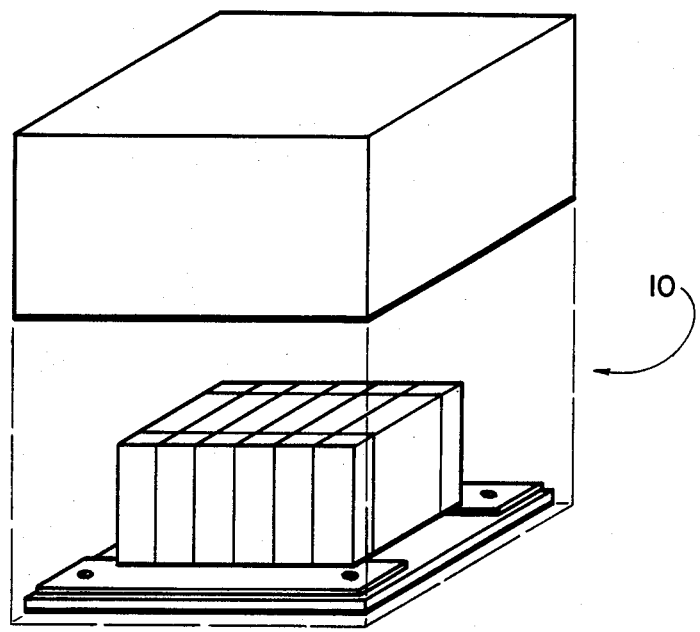
Fig. 1
Fig. 2B
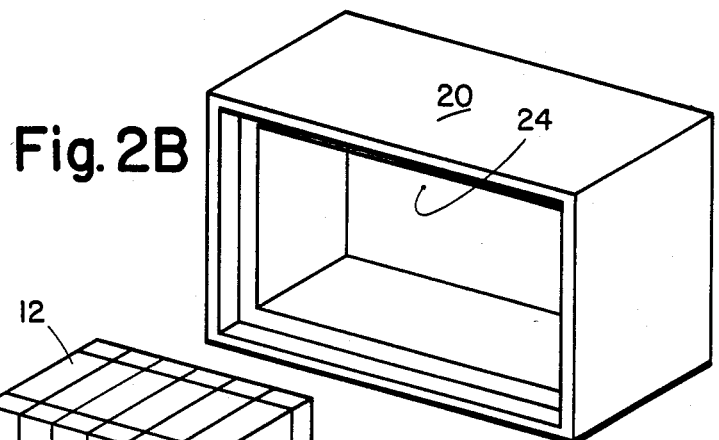
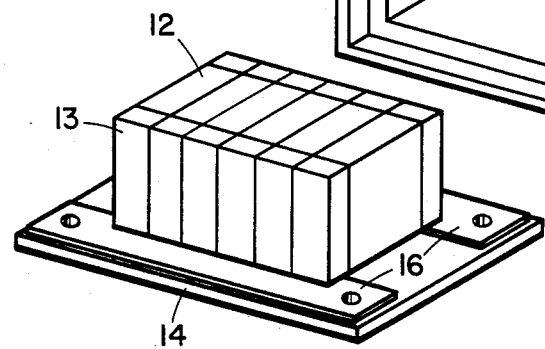
Fig. 2A

HIGH VALUE SURFACE MOUNTED CAPACITOR

BACKGROUND OF THE INVENTION

1. Field of the Invention

This invention pertains to the assembly of a plurality of base metal multilayer ceramic chip capacitors ganged to provide a single large capacitance or high value capacitor for high frequency applications. The capacitor is constructed with ceramic chip capacitors to perform with high reliability, and to provide high yield, low cost production. The impedance and ESR characteristics of such a capacitor should be superior to aluminum electrolytic capacitors of the same value at frequencies over 50 kilohertz.

2. Description of the Prior Art

For a variety of reasons it has become desirable to replace aluminum electrolytic capacitors with capacitors which have a higher reliability, a longer life and a lower cost. With the rapid progress of the electronics industry, electronic equipment has been making various demands of passive components for miniaturization, high performance, high reliability and long life. Multilayer ceramic capacitors have matured with the development of contemporary electronics and can meet all of these demands. The one drawback to multilayer ceramic capacitors has been the limited capacitance which can be achieved within a given size device. It is very difficult to produce a large capacitance capacitor with a single large chip component due to the higher probability of physical defects causing poor electrical performance. Significant increases in the physical size of multilayer ceramic chip capacitors are almost impossible to achieve because of very low production yield and very expensive costs.

Consequently, high capacitance in multilayer ceramic capacitors is achieved by constructing a single capacitor from a plurality of ganged chip capacitors. This technique provides high reliability, high production yield and low production costs. It further permits the manufacturer to utilize the fully automated production processes which have been built for conventional multilayer ceramic capacitors. Such large capacitance multilayer ceramic capacitors are constructed with ganged chip capacitors with a common terminal, leads and resin encapsulation. The dimensions of the constituent chip components are frequently standardized into a single size and capacitance value is also standardized into a single value at each working voltage. Various sizes of capacitor cases may be provided. The maximum capacitance value and the number of chip components may be varied. Copper terminations are frequently used for the various case sizes. Such large capacitance multilayer ceramic capacitors are commercially available from Murata Manufacturing Company and NEC Inc.

SUMMARY OF THE INVENTION

The principal object of the present invention is to create a high value, low profile, surface mountable ceramic capacitor for use in high frequency applications such as switch mode power supplies.

It is a further object of the invention to provide such a ceramic capacitor which is more rugged than prior art devices, which is non-polar and which has a longer useful life.

A further important object of the invention is to provide such a high capacitance multilayer ceramic capacitor which is surface mountable to lower the cost of circuit construction and which may also be conventionally mounted by means of pins to a circuit board through hole mounting technique without changing the basic construction of the device itself.

The high value surface mounted capacitor of the present invention, also known as a modular capacitor system, is a ganged assembly of a plurality of multilayer ceramic capacitors adapted to fit a novel package, which package is in turn adapted for use with automatic placement equipment for mounting surface mounted devices or conventional pin-type devices in an alternate embodiment. The modular capacitor system assembly utilizes a PC board having terminal footprints with plated through holes. The system permits a variety of capacitance values within a given package size by allowing one or more chip capacitors to be utilized, up to the maximum internal volume of the housing, chosen to achieve the desired capacitance values. Usually a plurality of multilayer ceramic capacitors are glued to each other and to the PC board such that the terminations overlie the terminal footprints. After curing the glue a solder paste is applied, a vapor phase reflow occurs, parts are degreased and the assembly is then placed in a housing. The housing is a hollow hexahedron made of high temperature thermoplastic. The housing is basically a six-sided structure, open at one end such that the PC board which forms the base of the ganged capacitor assembly is adapted to fit within the housing to form the sixth side of the hexahedron. The finished assembly, hexahedral in shape, has plated through contacts coming from the capacitor bus on the PC board to the opposite side of the PC board, which is the base of the housing. The present invention allows for a plurality of layouts for ganged capacitors on the PC board. Capacitors may be positioned thereon edgewise or they may be positioned along the width of the chip, then can be stacked in one or more rows depending upon the configuration of the layout of the ganged capacitors on the PC board, the footprints or capacitor busses.

BRIEF DESCRIPTION OF THE DRAWINGS

FIG. 1 is an exploded perspective view of a high value surface mounted capacitor according to the present invention.

FIGS. 2A and 2B are perspective views of the capacitor housing shown in FIG. 1.

DESCRIPTION OF THE PREFERRED EMBODIMENTS

The assembly of a plurality of base metal multilayer ceramic capacitors to provide a large single capacitance or high valued capacitor for high frequency applications is illustrated in FIG. 1 and FIGS. 2A and 2B. For purposes of this description and without any intent of limitation, the description will refer to specific types and values of chip capacitors. Referring now to the figures, a sixty microfarad, fifty volt unit 10 with a Z5U temperature characteristic is illustrated in its surface mount version in FIGS. 1, 2A and 2B. The chips 12 are of the size, 11.8 millimeters long ×10.0 millimeters wide. The terminations 13 of these chips 12 to be used in a solder reflow application may be any of the conventional terminations for use with base metal electrodes. As shown in FIG. 2, the chips 12 are placed side to side in a ganged configuration and held together by an adhesive. The ganged capacitors 12 are then placed in a package assembly which is adapted for use with automatic placement equipment, said equipment being either of the type used for mounting surface mounted components or conventional pin type devices as in the alternate embodiment. One feature of the package is that the number of ganged capacitors may vary from one up to the maximum which can be fitted into a given size package. The modular capacitor system of the present invention permits a variety of capacitance values within a given package size by allowing one or more chip capacitors to be utilized, up to the maximum internal volume of the package, chosen to achieve the desired capacitance values.

Figure 3A:
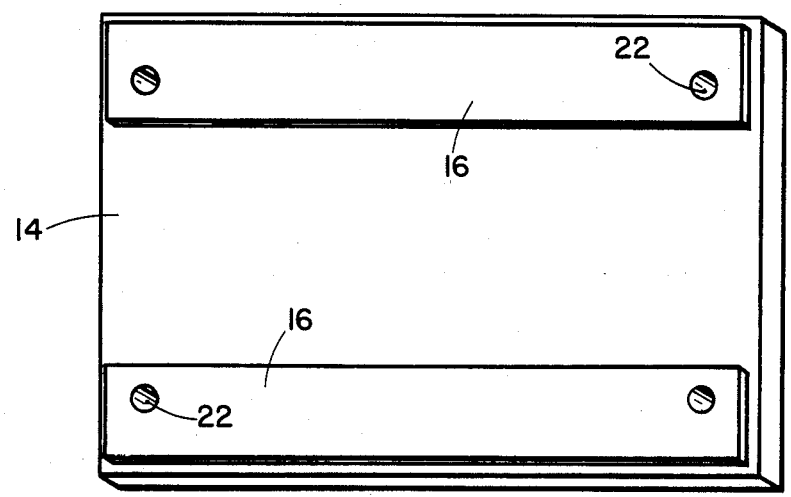
FIGS. 3A and 3B are top and bottom views of the circuit board used in the capacitor of FIG. 1.
Figure 3B:
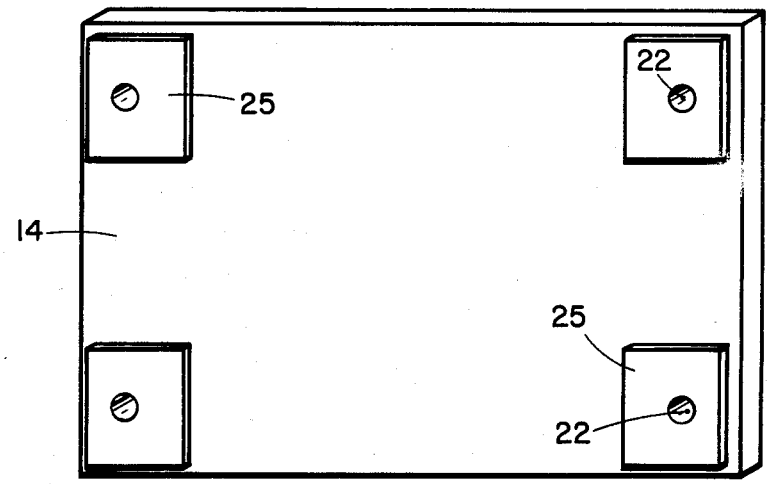

The package for the multiple capacitor system 10 of the present invention includes a PC board 14 with conductive terminal footprints 16 plated on the PC board 14 such that the one or more multilayer ceramic capacitors 12 which are ganged and glued to each other may also be glued to the PC board 14 such that their terminations 13 will overlie the conductive terminal footprints 16. The terminal footprints 16 in effect serve as a bus for the ganged capacitors 12. The layout of the terminal footprints 16 is shown in FIG. 3a. There it will be noted that the terminal footprints 16 are electrically connected to the opposite side of the substrate PC board 14 via plated through holes 22 terminating in mounting pads 25 at each corner of the PC board 14. This feature is also shown in FIGS. 1 and 2A. In an alternate embodiment these holes 22 would serve as a means for positioning leads in the event that the modular capacitor 10 of the present invention is used as a leaded device. If the modular capacitor 10 of the present invention is intended to be used as a surface mounted device, these holes 22 are filled with solder, (not shown in FIGS. 1 and 2A). The mounting pads 25 shown on FIG. 3B are all that is necessary to connect the modular capacitor 10 to a printed circuit board as a surface mounted device. Thus a plurality of multilayer ceramic capacitors 12 are glued to the PC board 14 such that the terminations 13 overlie the terminal footprints 16. After curing the glue a solder paste is applied, a vapor phase reflow occurs, parts are degreased and then the ganged assembly of multilayer capacitors 12 secured to the substrate 14 is placed in a housing 20. The housing 20 is a six sided hollow hexahedron made of high temperature thermoplastic. This housing 20 is basically a five-sided box-like structure in which the PC board 14 with multiple capacitor assembly 12 is inserted such that the base of the PC board 14 forms the sixth side of a hexahedron. The housing 20 is initially formed in a single cavity mold, but two or more cavities could be used. When the PC board 14 is placed in position to form the sixth side of housing 20, it is secured thereto by a sealing adhesive (not shown).

The process of assembling a modular capacitor 10 is as follows. A number of capacitors 12 are selected and their capacitance measured. Given the individual variations, an assembly can be made up of a range of individual capacitors which would yield the total desired capacitance. The capacitor chips 12 are then fastened together using an adhesive (not shown). This adhesive is then cured and the assembly of ganged capacitors 12 is then glued to the substrate 14 having conductive paths or footprints 16 by an adhesive. This adhesive is then cured, the assembly is then cleaned. A solder paste (not shown) is applied and it is also applied to plated through holes 22. A vapor phase reflow step then takes place to secure the chips 12 to the conductive footprints 16. The assemblies are then cleaned to remove solder flux and various other impurities. After testing and inspecting the assemblies, they are ready to be enclosed in housing 20. Housing 20 includes a recessed interior edge 24 to which a bead of sealing adhesive is applied. With housing 20 positioned opened end up the capacitor substrate assemblies are dropped in and pushed down to ensure adequate sealing of the substrate 14 against the case ledge 24. The adhesive is then cured, the final device 10 is tested and it is then ready for use.

Figure 4:
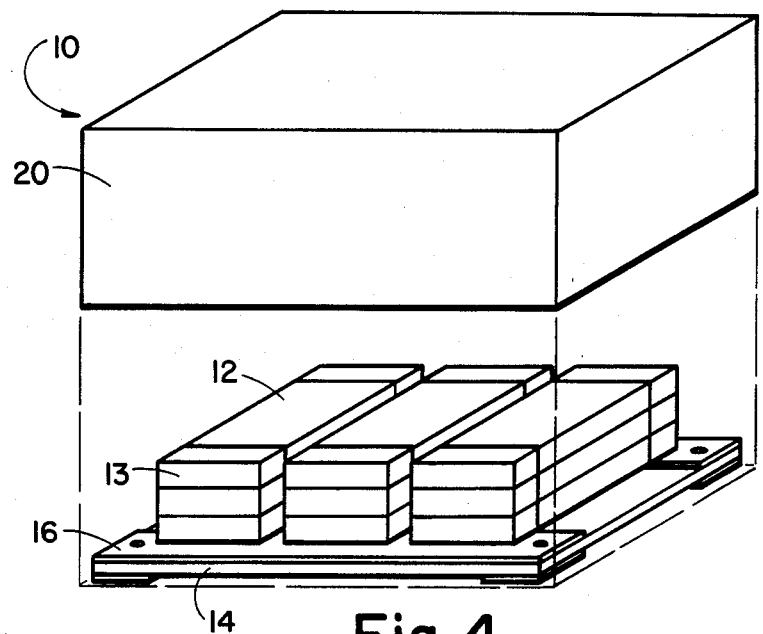
FIG. 4 is an exploded view of an alternate embodiment of the capacitor of FIG. 1.
Figure 5:
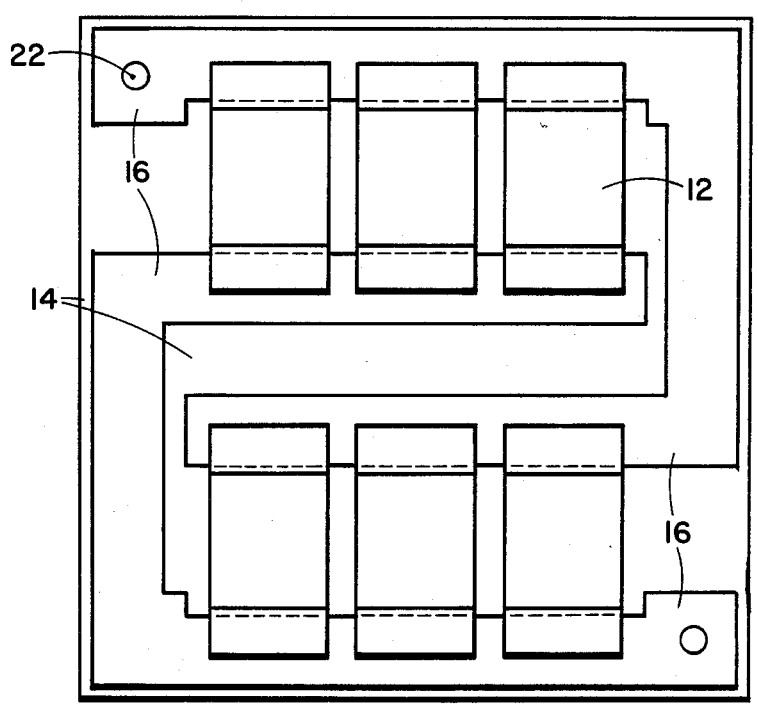
FIG. 5 is a top plan view of an alternate embodiment of the capacitor of FIG. 1.

FIGS. 4 and 5 show alternate arrangements of ganged capacitors which may be used to achieve a modular capacitor system 10 as disclosed in this application. Note that in FIG. 5 the conductive termination footprints 16 are a stylized Z shaped deposition.

I claim:

1. A modular capacitor system comprising:
   a substrate;
   at least two conductive termination footprints on said substrate;
   at least two ceramic capacitors being electrically connected to each other and to said substrate such that the end terminations of said capacitors are in conductive contact with said conductive termination footprints on said substrate;
   a five-sided housing of general hexahedral shape; said substrate having said capacitors connected thereto being inserted into said housing such that the base of said substrate forms the sixth side of the hexahedral housing; and
   a plurality of termination pads at the base of said housing in electrical contact with said termination footprints.

2. The modular capacitor of claim 1 wherein said means to electrically connect said capacitors comprises a plurality of plated through holes in the base of said hexahedral housing and electrically conductive leads connecting the terminations of said capacitors and said termination footprint through said holes to a circuit substrate.

* * * * *